United States Patent
Van Sommeren et al.

(10) Patent No.: US 10,120,290 B2
(45) Date of Patent: Nov. 6, 2018

(54) FLUID HANDLING STRUCTURE, IMMERSION LITHOGRAPHIC APPARATUS, AND DEVICE MANUFACTURING METHOD

(71) Applicant: ASML Netherlands B.V., Veldhoven (NL)

(72) Inventors: Daan Daniel Johannes Antonius Van Sommeren, Beuningen (NL); Bruno Jean François Frackowiak, Eindhoven (NL); Arend Koolma, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 15/327,334

(22) PCT Filed: Jun. 18, 2015

(86) PCT No.: PCT/EP2015/063691
§ 371 (c)(1),
(2) Date: Jan. 18, 2017

(87) PCT Pub. No.: WO2016/012164
PCT Pub. Date: Jan. 28, 2016

(65) Prior Publication Data
US 2017/0176867 A1    Jun. 22, 2017

(30) Foreign Application Priority Data

Jul. 24, 2014 (EP) .................................... 14178328

(51) Int. Cl.
*G03B 27/52* (2006.01)
*G03F 7/20* (2006.01)
*H01L 21/027* (2006.01)

(52) U.S. Cl.
CPC ............ *G03F 7/70341* (2013.01); *G03F 7/20* (2013.01); *G03F 7/2041* (2013.01); *H01L 21/0274* (2013.01)

(58) Field of Classification Search
CPC ...... G03F 7/70341; G03F 7/20; G03F 7/2041; G03F 7/709; G03F 2009/005; G03F 7/70
See application file for complete search history.

(56) References Cited

U.S. PATENT DOCUMENTS 6,952,253 B2    10/2005 Lof et al.
7,522,261 B2    4/2009 Luijten et al.
(Continued)

FOREIGN PATENT DOCUMENTS

EP    1 420 298    5/2004
EP    2 113 812    11/2009
(Continued)

OTHER PUBLICATIONS

International Search Report and Written Opinion dated Sep. 14, 2015 in corresponding International Patent Application No. PCT/EP2015/063691.
(Continued)

*Primary Examiner* — Mesfin Asfaw
(74) *Attorney, Agent, or Firm* — Pillsbury Winthrop Shaw Pittman LLP

(57) ABSTRACT

A fluid handling structure, an immersion lithographic apparatus and a device manufacturing method are disclosed. In one arrangement, a fluid handling structure has a fluid extraction conduit with a recovery port configured to receive a used fluid into the conduit. A plurality of flow breakers are provided that each extends across at least a portion of the conduit. The flow breakers are positioned downstream of the recovery port. The flow breakers are arranged so that a common plane cuts through at least a portion of two or more (Continued)

of the flow breakers. The common plane is aligned so as to be perpendicular to the average direction of flow in the conduit at the position of the common plane.

20 Claims, 9 Drawing Sheets

(56) References Cited

U.S. PATENT DOCUMENTS

| | | |
|---|---|---|
| 8,023,101 B2 | 9/2011 | Leenders et al. |
| 8,634,053 B2 | 1/2014 | Riepen et al. |
| 2004/0207824 A1 | 10/2004 | Lof et al. |
| 2006/0066826 A1 | 3/2006 | Luijten et al. |
| 2008/0007704 A1 | 1/2008 | Leenders et al. |
| 2008/0018866 A1 | 1/2008 | Nagasaka et al. |
| 2008/0212046 A1 | 9/2008 | Riepen et al. |
| 2009/0237638 A1 | 9/2009 | Nishikawara et al. |
| 2009/0268175 A1 | 10/2009 | Chibana et al. |
| 2010/0045949 A1 | 2/2010 | Nakano et al. |
| 2010/0134773 A1 | 6/2010 | Poon et al. |
| 2010/0283980 A1* | 11/2010 | Sato .................. G03F 7/70341 355/30 |

FOREIGN PATENT DOCUMENTS

| | | |
|---|---|---|
| EP | 2 338 580 | 6/2011 |
| JP | 2009-267235 | 11/2009 |
| JP | 2010-258453 | 11/2010 |
| JP | 2012-028772 | 2/2012 |
| JP | 2012-506641 | 3/2012 |
| JP | 2014-120693 | 6/2014 |
| WO | 2005-104195 | 11/2005 |

OTHER PUBLICATIONS

Japanese Office Action dated Jan. 5, 2018 in corresponding Japanese Patent Application No. 2016-575560.
Japanese office Action issued in corresponding Japanese Patent Application No. 2016-575560, dated Aug. 31, 2018.

* cited by examiner

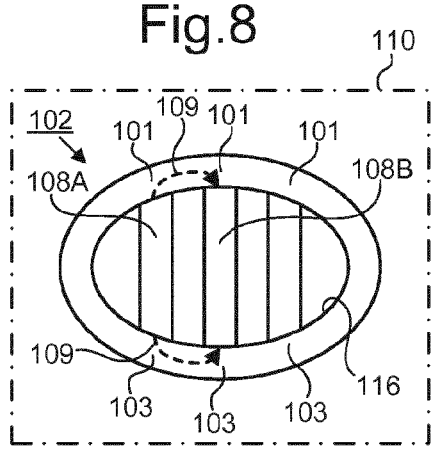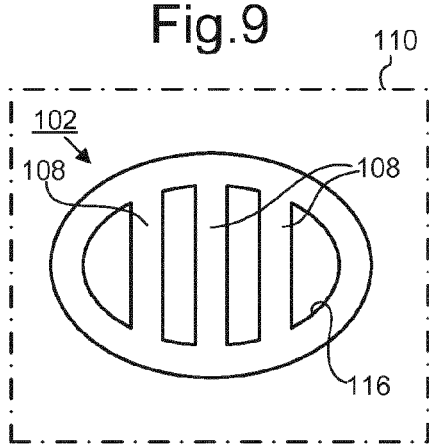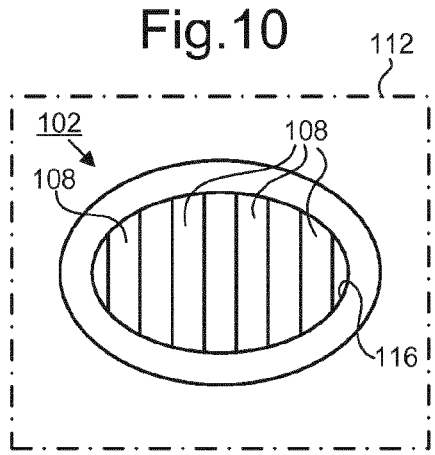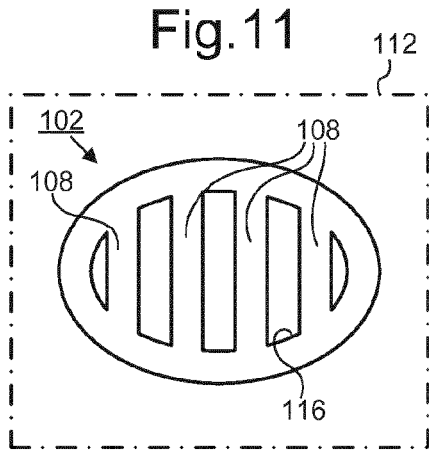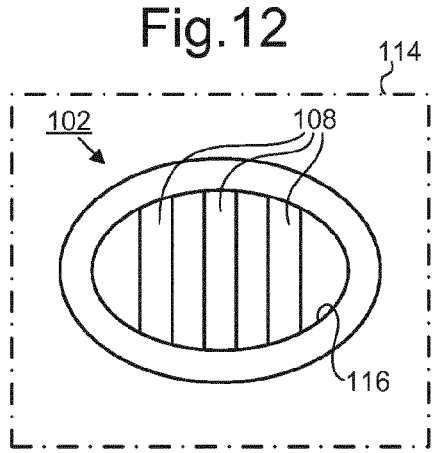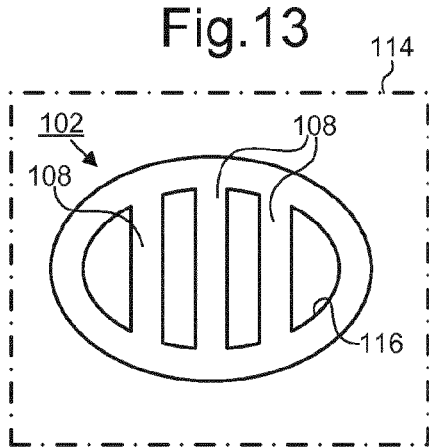

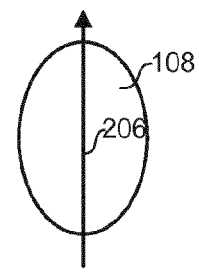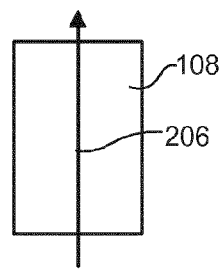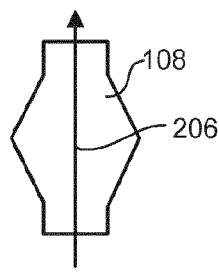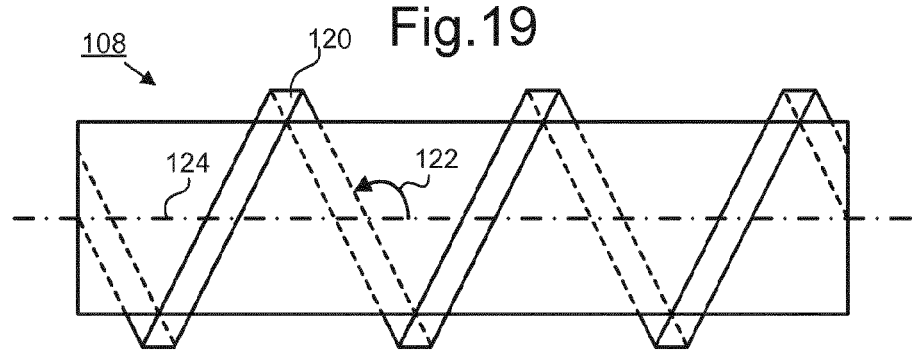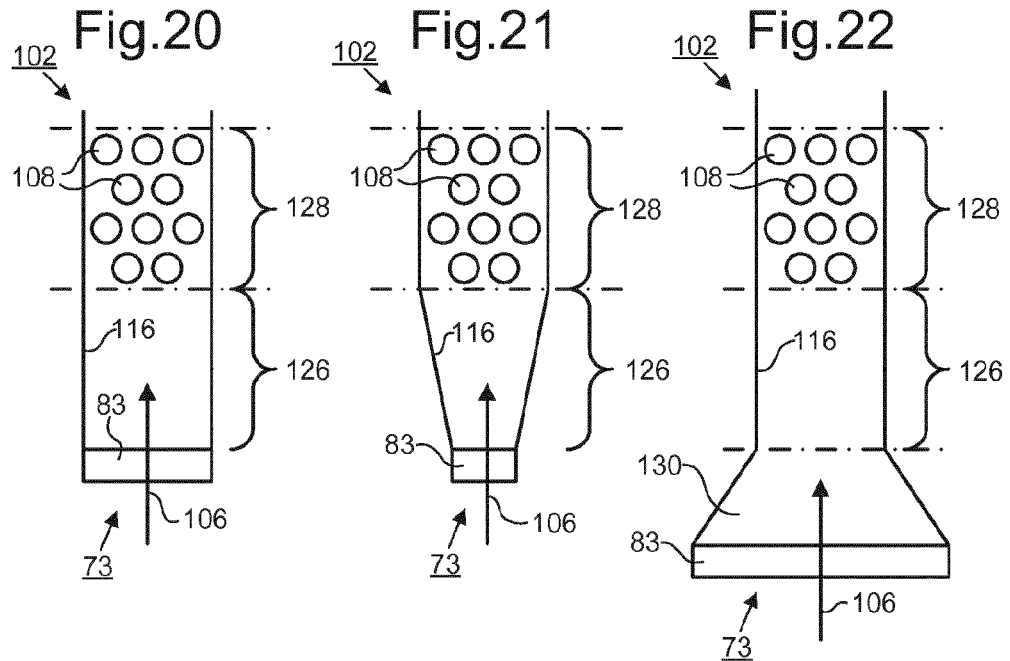

FLUID HANDLING STRUCTURE, IMMERSION LITHOGRAPHIC APPARATUS, AND DEVICE MANUFACTURING METHOD

This application is the U.S. national phase entry of PCT patent application no. PCT/EP2015/063691, which was filed on Jun. 18, 2015, which claims the benefit of priority of European patent application no. 14178328.2, which was filed on Jul. 24, 2014.

FIELD

The present invention relates to a fluid handling structure, an immersion lithographic apparatus and a device manufacturing method.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In an immersion lithographic apparatus, immersion fluid is handled by a fluid handling system or apparatus. In an embodiment the fluid handling system or apparatus may supply immersion fluid and therefore comprise or consist of a fluid supply system or apparatus. In an embodiment the fluid handling system or apparatus may at least partly confine immersion fluid. In an embodiment the fluid handling system or apparatus may provide a barrier to immersion fluid and thereby comprise or consist of a barrier member, such as a fluid confinement structure. In an embodiment the fluid handling system or apparatus may create or use a flow of gas, for example to help in controlling the flow and/or the position of the immersion fluid. The flow of gas may form a seal to confine the immersion fluid so the fluid handling system or apparatus may be referred to as a seal member; such a seal member may be a fluid confinement structure. In an embodiment, immersion liquid is used as the immersion fluid. In that case the fluid handling system or apparatus may be a liquid handling system or apparatus. Reference in this description to a feature defined with respect to fluid may be understood to include a feature defined with respect to liquid.

The fluid handling system or apparatus may be configured to conduct immersion fluid away from a space or region between a projection system and a substrate. The immersion fluid conducted away may be referred to as a used fluid. The used fluid may be conducted away through a fluid extraction conduit. Flow of the used fluid in the fluid extraction conduit can be unstable. Unstable flow is particularly common when the flow is a multiphase flow. A multiphase flow may comprise for example a mixture of gas and liquid. Unstable flow in the fluid extraction conduit can create or involve pressure fluctuations. Pressure fluctuations can cause vibrations to be transmitted to other elements of the immersion lithographic apparatus. Vibrations can negatively affect aspects of performance, for example focus or overlay.

SUMMARY

It is desirable, for example, to reduce flow instabilities in fluid extraction conduits.

According to an aspect, there is provided a fluid handling structure for use in an immersion lithographic apparatus, wherein the fluid handling structure is configured to provide an immersion fluid to a space between a final element of a projection system and an opposing surface that is moveable relative to the final element of the projection system, the fluid handling structure comprising: a fluid extraction conduit configured to conduct a used fluid away from the space, wherein the fluid extraction conduit comprises a recovery port configured to receive the used fluid into the conduit, and a plurality of flow breakers that each extend across at least a portion of the conduit; the flow breakers are positioned downstream of the recovery port; the flow breakers are arranged so that a common plane cuts through at least a portion of two or more of the flow breakers; and the common plane is aligned so as to be perpendicular to the average direction of flow, in use, in the conduit at the position of the common plane.

According to an aspect, there is provided a fluid handling structure for use in an immersion lithographic apparatus, wherein the fluid handling structure is configured to provide an immersion fluid to a space between a final element of a projection system and an opposing surface that is moveable relative to the final element of the projection system, the fluid handling structure comprising: a fluid extraction conduit configured to conduct a used fluid away from the space, wherein the fluid extraction conduit comprises a recovery port configured to receive the fluid into the conduit, a first length of conduit downstream from the recovery port and a second length of conduit downstream from the first length of conduit; the second length of conduit comprises a flow breaker extending across at least a portion of the conduit; the first length of conduit is elongate when viewed in at least one direction perpendicular to the average flow direction; and at all positions in the first length of conduit the cross-sectional area of the conduit, perpendicular to the average flow direction, is equal to or greater than the cross-sectional area of the conduit at the upstream end of the first length of conduit.

According to an aspect, there is provided a device manufacturing method, comprising: using a projection system to project a patterned radiation beam onto a substrate through an immersion fluid; providing the immersion fluid to a space between a final element of the projection system and the substrate or a support that is supporting the substrate; and using a fluid extraction conduit to conduct a used fluid away from the space, wherein the fluid extraction conduit comprises a recovery port configured to receive the used fluid into the conduit, and a plurality of flow breakers that each extend across at least a portion of the conduit; the flow breakers are positioned downstream of the recovery port; the flow breakers are arranged so that a common plane cuts through at least a portion of two or more of the flow breakers; and the common plane is aligned so as to be perpendicular to the average direction of flow in the conduit at the position of the common plane.

According to an aspect, there is provided a device manufacturing method, comprising: using a projection system to project a patterned radiation beam onto a substrate through an immersion fluid; providing the immersion fluid to a space between a final element of the projection system and the substrate or a support that is supporting the substrate; and using a fluid extraction conduit to conduct a used fluid away from the space, wherein the fluid extraction conduit comprises a recovery port configured to receive the fluid into the conduit, a first length of conduit downstream from the recovery port and a second length of conduit downstream from the first length of conduit; the second length of conduit comprises a flow breaker extending across at least a portion of the conduit; the first length of conduit is elongate when viewed in at least one direction perpendicular to the average flow direction; and at all positions in the first length of conduit the cross-sectional area of the conduit, perpendicular to the average flow direction, is equal to or greater than the cross-sectional area of the conduit at the upstream end of the first length of conduit.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 8 is a schematic sectional view along the flow direction of a first set of flow breakers for use in the embodiment of FIGS. 6 and 7;

FIG. 9 depicts an alternative first set of flow breakers;

FIG. 10 is a schematic sectional view along the flow direction of a second set of flow breakers for use in the embodiment of FIGS. 6 and 7;

FIG. 11 depicts an alternative second set of flow breakers;

FIG. 12 is a schematic sectional view along the flow direction of a third set of flow breakers for use in the embodiment of FIGS. 6 and 7;

FIG. 13 depicts an alternative third set of flow breakers;

FIG. 16 depicts an example cross section of a flow breaker;

FIG. 17 depicts a further example cross section of a flow breaker;

FIG. 18 depicts a still further example cross section of a flow breaker;

FIG. 19 is a schematic side view of a flow breaker having a surface structure that is configured to inhibit vortex shedding from the flow breaker;

FIG. 20 is a schematic side sectional view of a fluid extraction conduit according to an embodiment, illustrating relative positions of a first length of conduit and a second length of conduit;

FIG. 21 illustrates an alternative configuration of the type shown in FIG. 20;

FIG. 22 illustrates a further alternative configuration of the type shown in FIG. 20;

DETAILED DESCRIPTION

Figure 1:
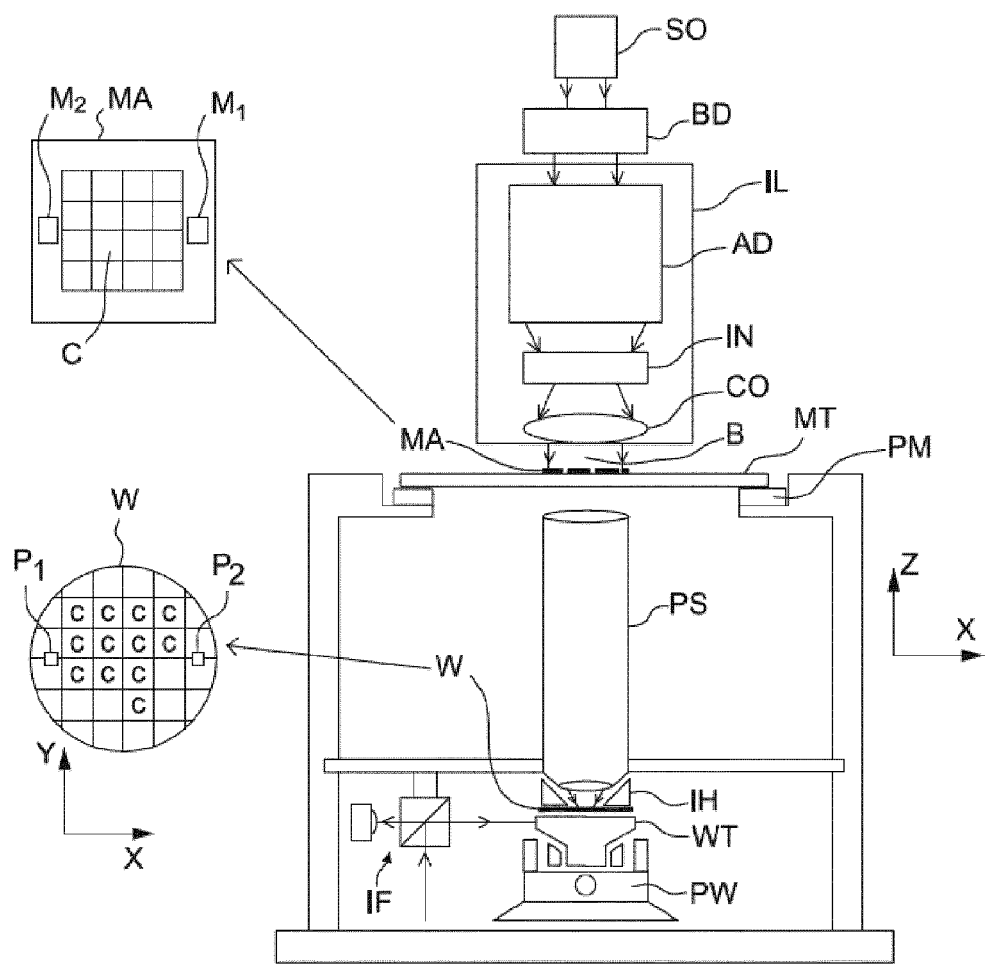
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section. Similar to the source SO, the illuminator IL may or may not be considered to form part of the lithographic apparatus. For example, the illuminator IL may be an integral part of the lithographic apparatus or may be a separate entity from the lithographic apparatus. In the latter case, the lithographic apparatus may be configured to allow the illuminator IL to be mounted thereon. Optionally, the illuminator IL is detachable and may be separately provided (for example, by the lithographic apparatus manufacturer or another supplier).

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

Arrangements for providing liquid between a final element of the projection system PS and the substrate can be classed into three general categories. These are the bath type arrangement, the so-called localized immersion system and the all-wet immersion system. In a bath type arrangement substantially the whole of the substrate W and optionally part of the substrate table WT is submersed in a bath of liquid.

Figure 2:
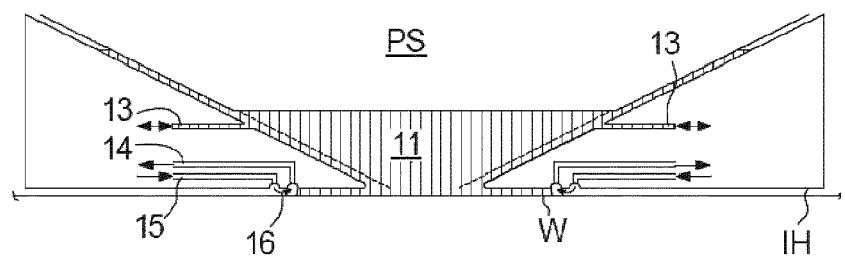
FIG. 2 depicts a liquid supply system for use in a lithographic apparatus.

An arrangement which has been proposed is to provide the liquid supply system with a liquid confinement structure which extends along at least a part of a boundary of the space between the final element of the projection system and the substrate, substrate table or both. Such an arrangement is illustrated in FIG. 2. The arrangement illustrated in FIG. 2 and described below may be applied to the lithographic apparatus described above and illustrated in FIG. 1.

FIG. 2 schematically depicts a localized liquid supply system or fluid handling system with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.) In an embodiment, a seal is formed between the liquid confinement structure IH and the surface of the substrate W and which may be a contactless seal such as a gas seal 16 (such a system with a gas seal is disclosed in European patent application publication no. EP-A-1,420, 298) or a liquid seal.

The liquid confinement structure IH at least partly contains liquid in the space 11 between a final element of the projection system PS and the substrate W. The space 11 is at least partly formed by the liquid confinement structure IH positioned below and surrounding the final element of the projection system PS. Liquid is brought into the space below the projection system PS and within the liquid confinement structure IH by liquid inlet 13. The liquid may be removed by liquid outlet 13.

The liquid may be contained in the space 11 by the gas seal 16 which, during use, is formed between the bottom of the liquid confinement structure IH and the surface of the substrate W. The gas in the gas seal 16 is provided under pressure via inlet 15 to the gap between the liquid confinement structure IH and substrate W. The gas is extracted via a channel (which may also be referred to as a fluid extraction conduit) associated with outlet 14 (which may also be referred to as a recovery port). The overpressure on the gas inlet 15, vacuum level on the outlet 14 and geometry of the gap are arranged so that there is a high-velocity gas flow inwardly that confines the liquid. The force of the gas on the liquid between the liquid confinement structure IH and the substrate W contains the liquid in the space 11. Such a system is disclosed in United States patent application publication no. US 2004-0207824, which is hereby incorporated by reference in its entirety. In an embodiment, the liquid confinement structure IH does not have a gas seal 16.

In a localized area liquid supply system, the substrate W is moved under the projection system PS and the liquid supply system. When, for example, an edge of the substrate W is to be imaged or when a sensor on the substrate table WT (or on a measurement table) is to be imaged or the substrate table WT is to be moved such that a dummy substrate or so-called closing plate can be positioned under the liquid supply system to enable, for example, substrate swap to take place, an edge of the substrate W (or other object) will pass under the space 11. Liquid may leak into the gap between the substrate W and substrate table WT. This liquid may be forced in under hydrostatic or hydrodynamic pressure or the force of a gas knife or other gas flow creating device.

In an embodiment a meniscus pinning system is provided that pins the edge of the liquid (i.e. the meniscus) underneath the liquid confinement structure IH in the space 11. The meniscus pinning system may rely on the so-called air drag extractor principle which has been described, for example, in US20080212046 A1. In that system recovery ports (i.e. openings) are placed in a cornered shape. The corners are aligned with the stepping and scanning directions. This reduces the force on the meniscus between two recovery ports for a given speed in the step or scan direction compared to if the two recovery ports were aligned perpendicular to the direction of scan.

Figure 3:
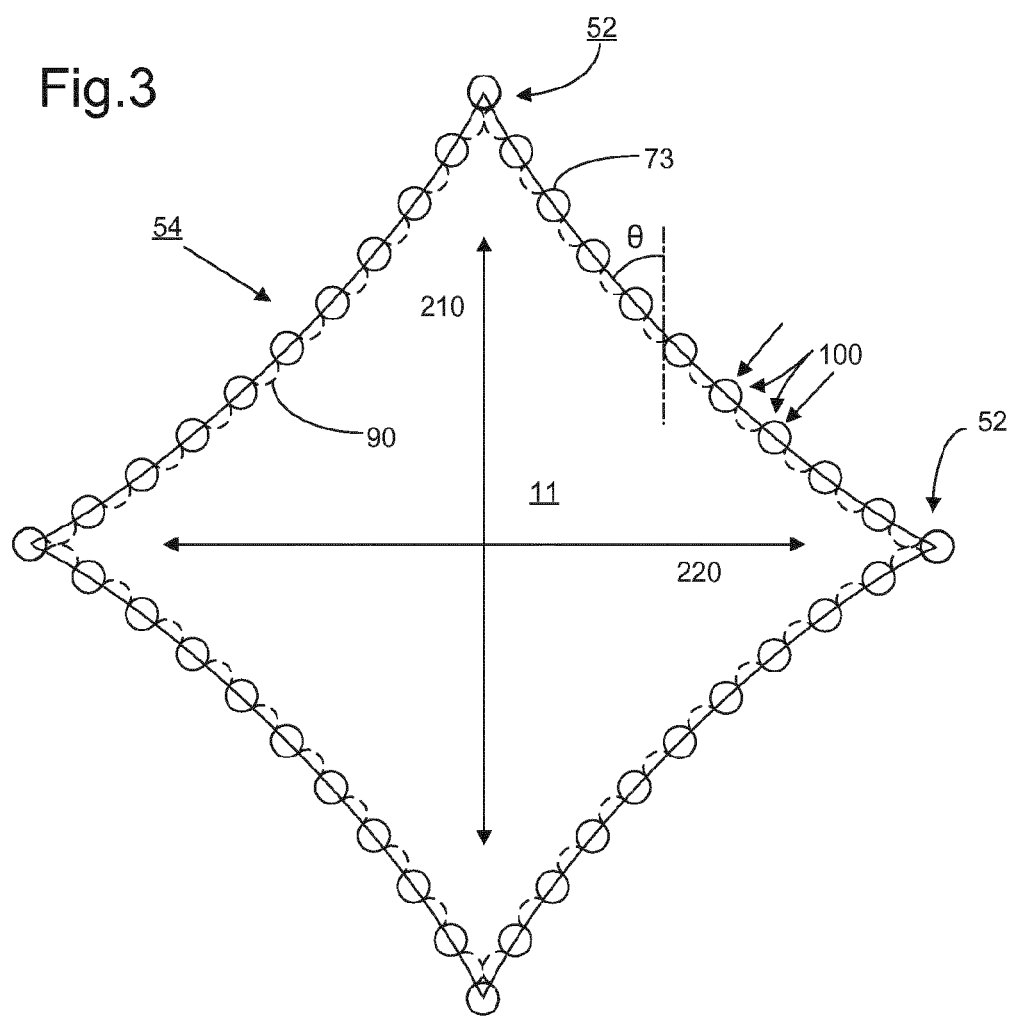
FIG. 3 is a schematic illustration, in plan, of a meniscus pinning system according to an embodiment.

FIG. 3 illustrates schematically and in plan a fluid handling structure or system having a meniscus pinning system. The meniscus pinning system illustrated may, for example, replace the arrangement 14, 15, 16 of FIG. 2 that confines the liquid in the space 11. The meniscus pinning system of FIG. 3 comprises a plurality of discrete recovery ports 73 (which may also be referred to as openings). Each of these recovery ports 73 is illustrated as being circular though this is not necessarily the case. Indeed one or more of the recovery ports 73 may be one or more selected from a square, rectangular, oblong, triangular, an elongate slit, etc. Each recovery port 73 has, in plan, a length dimension (i.e. in the direction from one recovery port 73 to the adjacent recovery port 73) of greater than 0.2 mm, desirably greater than 0.5 mm or 1 mm, in one embodiment between 0.1 mm and 10 mm, in one embodiment between 0.25 and 2 mm. In one embodiment the width of each recovery port 73 is between 0.1 mm and 2 mm. In another embodiment the width of each recovery port 73 is between 0.25 mm and 1 mm.

Each of the recovery ports 73 of the meniscus pinning system of FIG. 3 may be connected to a separate under pressure source. Alternatively or additionally, each or a plurality of the recovery ports 73 may be connected to a common chamber (which may be annular) which is itself held at an under pressure. In this way a uniform under pressure at each or a plurality of the recovery ports 73 may be achieved. The recovery ports 73 can be connected to a vacuum source and/or the atmosphere surrounding the fluid handling structure or system (or confinement structure, barrier member or liquid supply system) may be increased in pressure to generate the desired pressure difference.

The recovery ports 73 may be formed in a surface of a fluid handling structure (e.g. in a surface of a liquid confinement structure IH). That surface may face the substrate W and/or substrate table WT, in use. In one embodiment the recovery ports 73 are in a flat surface of the fluid handling structure. In another embodiment, a ridge may be present on the bottom surface of the fluid handling structure and the recovery ports 73 may be in the ridge. In an embodiment, the recovery ports 73 may be defined by needles. The bodies of some of the needles, e.g., adjacent needles, may be joined together. The needles may be joined together to form a single body. The single body may form the corner shape.

Figure 4:
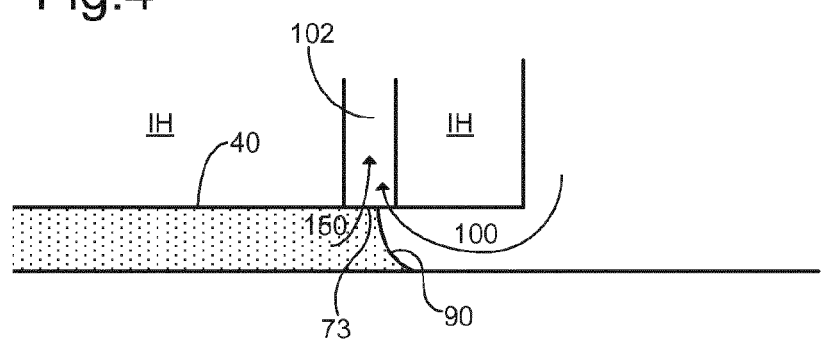
FIG. 4 depicts, in cross-section in a plane substantially parallel to the optical axis of the projection system, a meniscus pinning system according to an embodiment.

As can be seen from FIG. 4, the recovery ports 73 are provided at the end of a fluid extraction conduit 102 (in the form of a tube or elongate passageway for example). Desirably the recovery ports 73 are positioned such that they face the substrate W in use.

In this embodiment, each recovery port 73 is designed to extract a mixture of liquid and gas. The liquid is extracted from the space 11 whereas the gas is extracted from the atmosphere on the other side of the recovery port 73 to the liquid. This creates a liquid flow as illustrated by arrow 150 and a gas flow as illustrated by arrows 100. The gas flow 100 is effective to pin the meniscus 90 between the recovery ports 73 substantially in place as illustrated in FIG. 3. The gas flow 100 helps maintain confinement of the liquid by momentum blocking, by a gas flow induced pressure gradient and/or by drag (shear) of the air flow on the liquid.

The recovery ports 73 surround the space 11 to which the fluid handling structure supplies liquid. That is, the recovery ports 73 are substantially continuously spaced around the space 11 (the spacing between adjacent recovery ports 73 may be regular or may vary). This differs to US patent publication number US2008007704 in which extraction openings (recovery ports) are in four separate cornered lines rather than a cornered shape (there are no openings along part of the edges between corners). This is because in US2008007704 liquid is forced substantially tangentially towards the corners where it is extracted by gas knives. In an embodiment of the present invention liquid is extracted all the way around the cornered shape and is extracted substantially at the point at which it impinges on the cornered shape. This is achieved because the recovery ports 73 are formed all the way around the space 11 (in the cornered shape).

As can be seen from FIG. 3, the recovery ports 73 are positioned so as to form, in plan, a cornered shape (i.e. a shape with corners 52). In the case of FIG. 3 this is in the shape of a square with curved edges or sides 54. The edges 54 have a negative radius. That is, they curve towards the centre of the cornered shape in areas away from the corners 52.

The square has principal axes 210, 220 aligned with the major directions of travel of the substrate W under the projection system PS. This helps ensure that the maximum scan speed is faster than if the recovery ports 73 were arranged in a circular shape. This is because the force on the meniscus 90 between two recovery ports 73 is reduced with a factor cos θ. Here θ is the angle of the line connecting the two recovery ports 73 relative to the direction in which the substrate W is moving.

Therefore the use of a square shape allows movement in the step and scanning directions to be at an equal maximum speed. If movement in one of the directions, for example the scan direction is preferred to be faster than movement in the step direction then a rhombus shape could be used. In such an arrangement the primary axis of the rhombus may be aligned with the scan direction. For a rhombic shape, although each of the corners may be acute, the angle between two adjacent sides of the rhombus, for example in the stepping direction, may be obtuse, i.e. more than 90° (for example between about 90° and 120°, in an embodiment between 90° and 105°. In an embodiment the angle is between 85° and 105°).

Thus, throughput can be optimized by making the primary axis of the shape of the recovery ports 73 aligned with the major direction of travel of the substrate W (usually the scan direction) and to have a second axis aligned with the other major direction of travel of the substrate W (usually the step direction). It will be appreciated that any arrangement in which θ is different to 90° will give an advantage. Thus, exact alignment of the principal axes with the major directions of travel is not vital. It will further be appreciated that if the shape is circular, then there will always be two recovery ports 73 which are aligned perpendicularly to the direction of travel so that the meniscus 90 between those two recovery ports 73 receives the maximum available force by movement of the substrate W.

FIG. 4 illustrates that the recovery port 73 is provided in a bottom surface 40 of the liquid confinement structure IH. This is however not necessarily the case and the recovery ports 73 may be provided above the bottom surface 40 or in a protrusion from the bottom surface 40.

There may be no meniscus pinning features radially inwardly of the recovery ports 73. There may be no other components or meniscus pinning features radially outwardly of the recovery ports 73. Thus, in comparison to the liquid confinement system of FIG. 2, there is no gas inlet 15 or equivalent and the outlet 14 has been split into several discrete recovery ports 73 each connected to, e.g., an under pressure source. The meniscus 90 is pinned between the recovery ports 73 with drag forces induced by the gas flow 100 into the recovery ports 73. A gas drag velocity of greater than about 15 m/s, desirably 20 m/s is sufficient. By avoiding the need for a gas knife, the amount of evaporation of liquid from the substrate may be reduced thereby reducing both splashing of liquid as well as thermal expansion/contraction effects. However, an embodiment of the present invention is not limited to the structure illustrated and further meniscus pinning features could be present radially inwardly and/or radially outwardly of the recovery ports 73.

Figure 5:
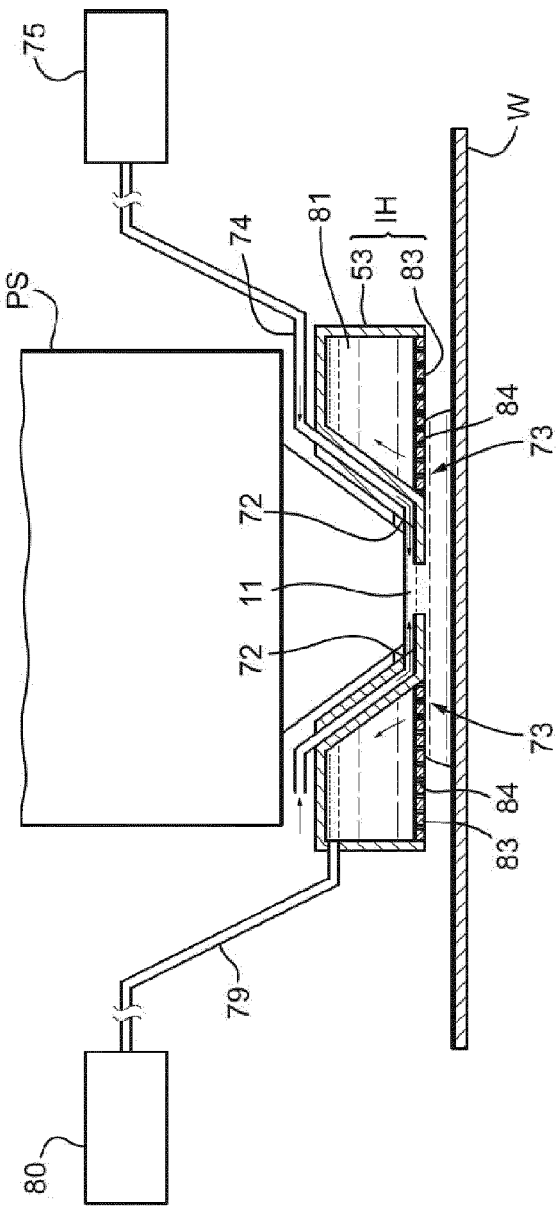
FIG. 5 is a side cross sectional view that depicts a further liquid supply system according to an embodiment.

FIG. 5 is a side cross sectional view that depicts a further liquid supply system or fluid handling system according to a further embodiment. The arrangement illustrated in FIG. 5 and described below may be applied to the lithographic apparatus described above and illustrated in FIG. 1. The liquid supply system is provided with a liquid confinement structure IH, which extends along at least a part of a boundary of the space 11 between the final element of the projection system PS and the substrate table WT or substrate W. (Please note that reference in the following text to surface of the substrate W also refers in addition or in the alternative to a surface of the substrate table WT, unless expressly stated otherwise.)

The liquid confinement structure IH at least partly contains liquid in the space 11 between a final element of the projection system PS and the substrate W. The space 11 is at least partly formed by the liquid confinement structure IH positioned below and surrounding the final element of the projection system PS. In an embodiment, the liquid confinement structure IH comprises a main body member 53 and a porous member 83. The porous member 83 is plate shaped and has a plurality of holes (i.e., openings or pores). In an embodiment, the porous member 83 is a mesh plate wherein numerous small holes 84 are formed in a mesh. Such a system is disclosed in United States patent application publication no. US 2010/0045949 A1, which is hereby incorporated by reference in its entirety.

The main body member 53 comprises supply ports 72, which are capable of supplying the liquid to the space 11, and a recovery port 73, which is capable of recovering the liquid from the space 11. The supply ports 72 are connected to a liquid supply apparatus 75 via passageways 74. The liquid supply apparatus 75 is capable of supplying the liquid to the supply ports 72. The liquid that is fed from the liquid supply apparatus 75 is supplied to each of the supply ports 72 through the corresponding passageway 74. The supply ports 72 are disposed in the vicinity of the optical path at prescribed positions of the main body member 53 that face the optical path. The recovery port 73 is capable of recovering the liquid from the space 11. The recovery port 73 is connected to a liquid recovery apparatus 80 via a passageway 79. The liquid recovery apparatus 80 comprises a vacuum system and is capable of recovering the liquid by suctioning it via the recovery port 73. The liquid recovery apparatus 80 recovers the liquid LQ recovered via the recovery port 73 through the passageway 79. The porous member 83 is disposed in the recovery port 73.

In an embodiment, to form the space 11 with the liquid between the projection system PS and the liquid confinement structure IH on one side and the substrate W on the other side, liquid is supplied from the supply ports 72 to the space 11 and the pressure in a recovery chamber 81 in the liquid confinement structure IH is adjusted to a negative pressure so as to recover the liquid via the holes 84 (i.e., the recovery port 73) of the porous member 83. Performing the liquid supply operation using the supply ports 72 and the liquid recovery operation using the porous member 83 forms the space 11 with the liquid between the projection system PS and the liquid confinement structure IH on one side and the substrate W on the other side.

Embodiments of a fluid handling structure will now be described. The fluid handling structure may be configured for use in an immersion lithographic apparatus. The fluid handling structure may form part of the immersion lithographic apparatus. The immersion lithographic apparatus may be configured as described above with reference to FIG. 1. The fluid handling structure may form part of, or constitute, a fluid supply system or a liquid supply system as described above and illustrated in FIG. 2 or FIG. 5. The fluid handling structure may form part of, or comprise, or constitute, a fluid confinement structure in a localized area liquid supply system. The fluid handling structure may comprise a meniscus pinning system as described above and illustrated in FIGS. 3 and 4.

In an embodiment, a fluid handling structure is provided that is configured to provide an immersion fluid to a space between a final element of a projection system PS and an opposing surface. The opposing surface may be movable relative to the final element of the projection system PS. The fluid handling structure may for example form part of a liquid supply system such as that depicted in FIG. 2 or 5 or which comprises a meniscus pinning system as depicted in FIGS. 3 and 4. The space between the final element of a projection system PS and the opposing surface may correspond to the space 11 between the final element of the projection system PS and the substrate W described above with reference to FIG. 2, 3, 4 or 5. An upper surface of the substrate W is an example of an opposing surface that is movable relative to the final element of the projection system PS. An upper surface of the substrate table WT is another example of an opposing surface that is movable relative to the final element of the projection system PS.

In an embodiment, the fluid handling structure comprises a fluid extraction conduit. The fluid extraction conduit is configured to conduct a used fluid away from the space 11 between the final element of the projection system PS and the opposing surface. In the embodiment of FIG. 2, the fluid extraction conduit may be the channel associated with the outlet 14. In the embodiment of FIGS. 3 and 4, the fluid extraction conduit 102 may be configured to operate between the recovery port 73 and a common chamber held at an under pressure. In the embodiment of FIG. 5, the fluid extraction conduit may be configured to operate between the recovery port 73 and the liquid recovery apparatus 80 for example. Fluid extracted through the recovery port 73 may be conducted through the fluid extraction conduit to the liquid recovery apparatus 80.

Figure 6:
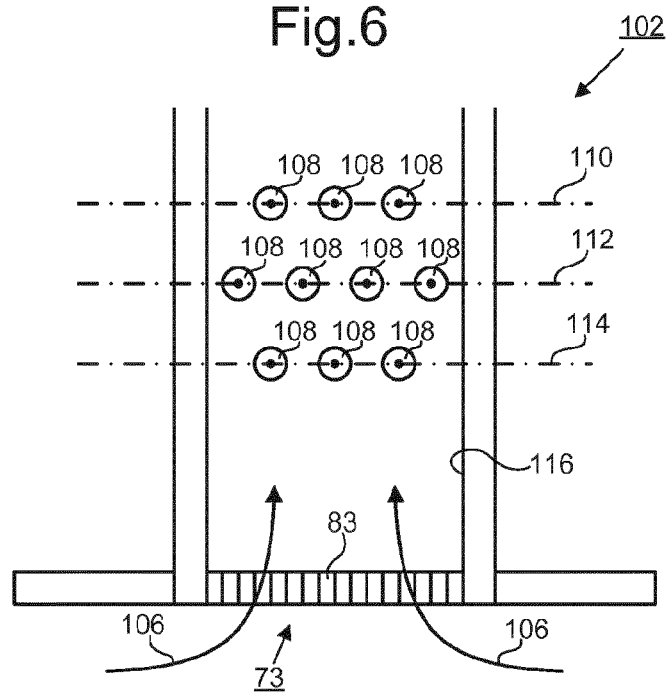
FIG. 6 is a first schematic side sectional view of a fluid extraction conduit in a fluid handling structure according to an embodiment.
Figure 7:
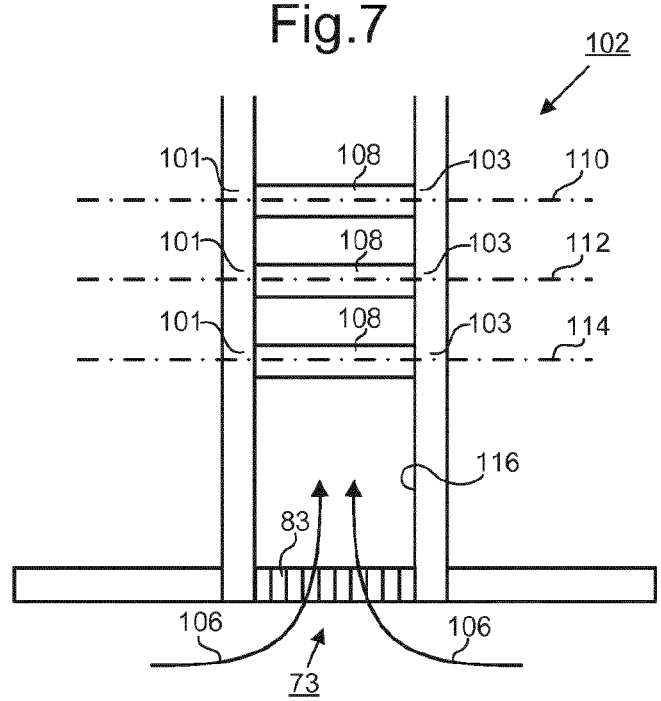
FIG. 7 is a second schematic side sectional view of the fluid extraction conduit of FIG. 6.

FIGS. 6 to 13 depict a fluid extraction conduit 102 according to an embodiment. FIG. 6 is a schematic side sectional view of the fluid extraction conduit 102 when viewed along a first axis. FIG. 7 is a schematic side sectional view of the fluid extraction conduit 102 when viewed along a second axis. The first axis is perpendicular to the second axis. In this embodiment, and in other embodiments, the fluid extraction conduit 102 comprises a recovery port 73. The recovery port 73 is configured to receive the used fluid into the conduit 102 (arrows 106). In this embodiment, and in other embodiments, a plurality of flow breakers 108 are provided. Each of the flow breakers 108 extends across at least a portion of the conduit 102. The flow breakers 108 are positioned downstream of the recovery port 73. In this embodiment, and in other embodiments, the flow breakers 108 are arranged so that a common plane cuts through at least a portion of two or more of the flow breakers 108. The common plane is aligned so as to be perpendicular to the average direction of flow, in use, in the conduit 102 at the position of the common plane. In the first embodiment, the plurality of flow breakers 108 comprises three sets of flow breakers 108. Each set of flow breakers 108 comprises a plurality of flow breakers 108. A first set of flow breakers 108 is arranged so that a first common plane 110 cuts through at least a portion of each and every one of the flow breakers 108 in the first set. In FIGS. 6 and 7, the flow breakers 108 in the first set are the flow breakers 108 in the top row. In this embodiment, a second set of flow breakers 108 is arranged so that a second common plane 112 cuts through at least a portion of each and every one of the flow breakers 108 in the second set. In FIGS. 6 and 7, the flow breakers 108 in the second set are the flow breakers 108 in the middle row. In this embodiment, a third set of flow breakers 108 is arranged so that a third common plane 114 cuts through at least a portion of each and every one of the flow breakers 114 in the third set. In FIGS. 6 and 7, the flow breakers 108 in the third set are the flow breakers 108 in the bottom row.

In the orientation of FIGS. 6 and 7 the average direction of flow in the region where the flow breakers 108 are located is vertically upwards. The first common plane 110, second common plane 112 and third common plane 114 are all perpendicular to the average direction of flow and are therefore horizontal in this example.

In the embodiment of FIGS. 6 and 7, and in other embodiments, the flow breakers 108 may have a cylindrical form. Flow breakers 108 having a cylindrical form can be manufactured easily and provide relatively low drag. The flow breakers 108 may have other forms as is discussed in detail below with reference to FIGS. 16 to 18.

FIGS. 8 to 13 are schematic sectional views of example flow breakers 108 compatible with the embodiment of FIGS. 6 and 7, viewed along the average direction of flow at the positions of the flow breakers 108 (i.e. vertically downwards in the orientation of FIGS. 6 and 7). FIGS. 8 and 9 are sections at the position of the first common plane 110. FIGS. 10 and 11 are sections at the position of the second common plane 112. FIGS. 12 and 13 are sections at the position of the third common plane 114. Consistent with FIGS. 6 and 7, it can be seen that the first common plane 110 and the third common plane 114 cut through three of the flow breakers 108. The second common plane 112 cuts through four of the flow breakers 108.

In an embodiment, the fluid extraction conduit 102 comprises a peripheral wall 116. The peripheral wall 116 is configured to contain fluid peripherally within the fluid extraction conduit 102. Containing fluid peripherally may comprise containing fluid in a direction perpendicular to an average flow direction in the fluid extraction conduit 102 (i.e. preventing fluid from escaping from the fluid extraction conduit 102 in one or more directions perpendicular to the average flow direction). For example, in the case where the fluid extraction conduit 102 is cylindrical, the peripheral wall may contain the fluid radially. In an embodiment, a plurality of flow breakers 108 may protrude inwardly from the peripheral wall 116. Alternatively or additionally, a plurality of flow breakers 108 may span across the fluid extraction conduit 102 from one region on the peripheral wall 116 to another region on the peripheral wall 116.

Figure 24:
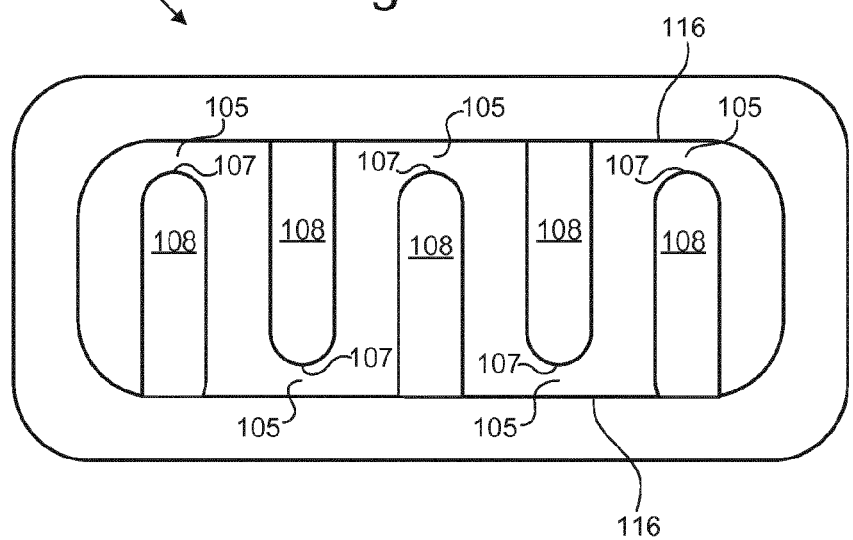
FIG. 24 is a schematic side sectional view along the flow direction of flow breakers that protrude inwardly but do not span across the fluid extraction conduit.

The embodiments discussed with reference to FIGS. 6-13 are examples in which a plurality of flow breakers 108 are provided that protrude inwardly from the peripheral wall 116. In these embodiments the flow breakers 108 also span across the fluid extraction conduit 102 from one region 101 to another region 103 on the peripheral wall 116 (see FIGS. 7 and 8 where examples of the regions 101 and 103 are marked). It is not essential for flow breakers 108 that protrude inwardly to also span across the fluid extraction conduit 102. FIG. 24 depicts an example fluid extraction conduit 102 in which a plurality of flow breakers 108 protrude inwardly but do not span across the fluid extraction conduit 102. There are gaps 105 between leading tips 107 of the flow breakers 108 and an opposing inner surface of the peripheral wall 116.

Providing a plurality of flow breakers 108 that protrude inwardly in this manner reduces the space available for flow instabilities. Reducing the space available for flow instabilities reduces the maximum size of the flow instabilities. A larger scale flow instability (which may also be referred to as a flow fluctuation) is divided into multiple smaller scale flow instabilities. The energy contained within the smaller scale flow instabilities is relatively small. Furthermore, the multiple smaller scale flow instabilities are able to cancel each other out. The performance of the lithographic apparatus may therefore be less negatively affected by the flow instabilities.

In an embodiment, at least one of the flow breakers 108 is a discrete element. In an embodiment of this type, the only connection between the flow breaker 108 and any other of the flow breakers 108 may be made via the peripheral wall 116. All of the flow breakers 108 in FIGS. 6-13 are examples of flow breakers 108 that are discrete elements in this sense. As is shown schematically in FIG. 8, example flow breaker 108A is connected to flow breaker 108B only via the peripheral wall 116 (via paths 109).

Forming flow breakers 108 as discrete elements makes it easier to provide an optimum balance between reducing damaging flow instabilities (which is desirable) and increasing flow resistance too much (which is undesirable). Increasing the number of flow breakers 108 will tend to result in smaller distances on average between different flow breakers 108. Smaller distances on average between different flow breakers 108 will tend to reduce the average size of flow instabilities. Flow instabilities of smaller average size will tend to be less damaging to lithographic performance than larger flow instabilities. However, increasing the number of flow breakers 108 will also tend to increase the flow resistance. In an embodiment, the number and/or form of the flow breakers 108 is/are chosen to achieve a satisfactory balance. The satisfactory balance may comprise keeping the length scale of the flow instabilities predominantly or entirely below a critical length scale using a set of flow breakers 108 that applies a minimum drag. The critical length scale may be a length scale above which it is known that the vibrations resulting from the flow instabilities will damage performance of the lithographic apparatus by a predetermined amount.

Figure 23:
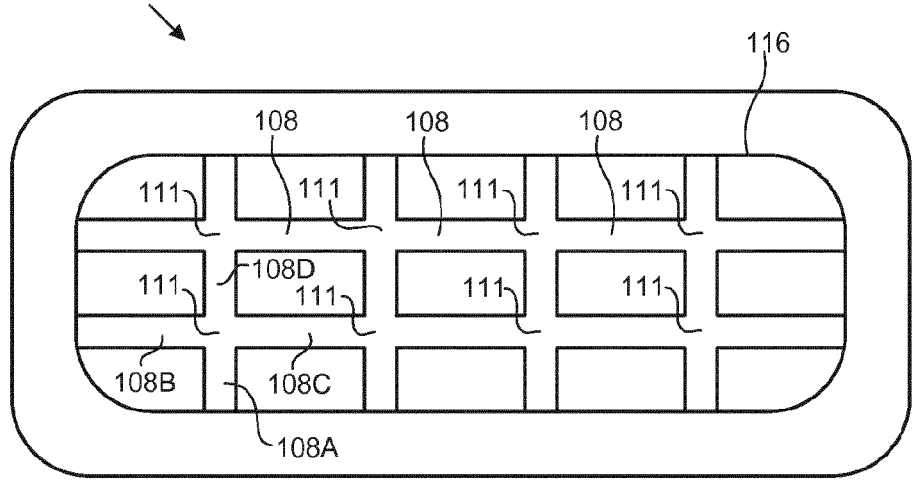
FIG. 23 is a schematic side sectional view along the flow direction of flow breakers containing branches.

In other embodiments, two or more of the plurality of flow breakers 108 may be connected directly to each other (i.e. not via the peripheral wall 116). In an embodiment, all of the flow breakers 108 are connected directly to each other. A connection between two different flow breakers 108 may be referred to as a branching point 111. An example of a fluid extraction conduit comprising a plurality of flow breakers 108 connected together via branching points 111 is shown in FIG. 23. Example flow breakers 108A, 108B, 108C and 108D are connected together by a single branching point 111. Thus, flow breaker 108A branches at the branching point 111 into flow breaker 108B, flow breaker 108C and flow breaker 108D. Providing flow breakers 108 that are connected together via branching points 111 may facilitate mounting of the flow breakers 108. Additionally or alternatively, providing flow breakers 108 that are connected together in this manner may desirably facilitate reduction of the space available for flow instabilities in multiple directions within the common plane 110, 112, 114 (by providing flow breakers that extend in non-parallel directions). This can be understood by comparison with the alternative case of a plurality of flow breakers 108 that are coplanar and parallel to each other. Here, the space available for flow instabilities within the plane of the flow breakers 108 is limited in the direction perpendicular to the flow breakers 108 (by the distance between the flow breakers 108) whereas the space available for flow instabilities within the plane of the flow breakers 108 is less (or not) limited in directions parallel to the flow breakers 108. Providing flow breakers 108 that extend in non-parallel directions limits the space for flow instabilities in more directions because there will be fewer or no directions that are parallel to plural flow breakers 108.

Providing a plurality of flow breakers 108 in a common plane 110, 112, 114 (i.e. cut through by the common plane 110, 112, 114) that is perpendicular to the flow allows effective suppression of flow instabilities in a compact manner. The flow breakers 108 in such a configuration are effective at reducing the space available for flow instabilities in directions perpendicular to the flow direction (i.e. directions within the common plane 110, 112, 114). The flow breakers 108 are particularly effective at reducing the space available for flow instabilities in directions perpendicular to axes of elongation (for elongate flow breakers) or axes of rotational symmetry (for rotationally symmetric flow breakers) of the flow breakers 108. An axis of rotational symmetry is an axis about which the flow breaker 108 has rotational symmetry. Thus, flow breakers 108 that are rotationally symmetric look the same when rotated about the axis of rotational symmetry by an angle of 360°/n, where n is an integer equal to or greater than 2. The integer n is the order of rotational symmetry. For example, a flow breaker 108 that has rotational symmetry of order 2 will look the same when rotated about the axis of symmetry by 180°.

In an embodiment, at least a subset (optionally all) of the plurality of flow breakers 108 are elongate. In an embodiment of this type each of the plurality of flow breakers 108 that are elongate has an associated axis of elongation. Optionally, each of the plurality of flow breakers 108 that are elongate is rotationally symmetric and has an associated axis of rotational symmetry. The axes of elongation or the axes of rotational symmetry may lie in a common plane. In the embodiments depicted in FIGS. 6-13, the flow breakers 108 are all elongate and rotationally symmetric. The flow breakers 108 are cylindrical. Each of the axes of elongation is also an axis of rotational symmetry (the longitudinal axis of the cylinder).

In the particular embodiments of FIGS. 6-13 there are three common planes 110, 112 and 114. In other embodiments there may be fewer than three or more than three common planes. The axes of elongation and the axes of rotational symmetry of all of the flow breakers 108 in the first set of flow breakers 108 lie in the common plane 110. The axes of elongation and the axes of rotational symmetry of all of the flow breakers 108 in the second set of flow breakers lie in the common plane 112. The axes of elongation and the axes of rotational symmetry of all of the flow breakers 108 in the third set of flow breakers 108 lie in the common plane 114.

Arranging flow breakers 108 such that their axes of elongation or axes of rotational symmetry lie in a common plane provides an effective reduction of flow instabilities without increasing the flow resistance too much. Furthermore, the plurality of flow breakers 108 remain compact.

The flow breakers 108 occupy minimum space along the direction of flow. Furthermore, the plurality of flow breakers 108 can be mounted to the fluid extraction conduit 102 more efficiently. For example a mounting element (not depicted in the drawings) that is provided at a single position along the length of the fluid extraction conduit 102 may be used to mount all of the flow breakers 108 that are mounted in a common plane at the position of the mounting element.

Providing a plurality of common planes 110, 112, 114 at different positions along the fluid extraction conduit 102 (such as in the embodiment of FIGS. 6-13) provides further reduction of flow instabilities by reducing the space available for flow instabilities in directions parallel to the average flow direction (i.e. perpendicular to the common planes 110, 112, 114).

In an embodiment at least a subset of the flow breakers 108 are regularly spaced apart from each other (i.e. with substantially the same spacing between different neighboring pairs of flow breakers 108). In the particular embodiments of FIGS. 6-13 for example, all of the flow breakers 108 in the first set of flow breakers 108 are regularly spaced apart from each other. All of the flow breakers 108 in the second set of flow breakers 108 are regularly spaced apart from each other. All of the flow breakers 108 in the third set of flow breakers 108 are regularly spaced apart from each other. Spacing the flow breakers 108 apart regularly provides an effective balance between reducing damaging flow instabilities and minimizing any increase of flow resistance caused by the flow breakers 108. In an embodiment, the flow breakers 108 in one common plane may be shifted relative to the flow breakers 108 in at least one neighboring common plane. For example, the flow breakers 108 may be shifted so that each flow breaker 108 in one common plane faces a gap between flow breakers 108 in at least one neighboring common plane (as shown for example in FIGS. 6 and 7).

In an embodiment, the fluid extraction conduit 102 comprises a porous member 83. The porous member 83 may span the fluid extraction conduit 102 at a position upstream from the flow breakers 108. The embodiments of FIGS. 6-13 comprise such a porous member 83 for example. The porous member 83 may however be omitted from the embodiments of FIGS. 6-13. The porous member 83 may also be omitted from other embodiments. The porous member 83 may prevent or reduce disruption to immersion fluid in the space 11 caused by flow instabilities in the fluid extraction conduit 102.

In the embodiments discussed above the flow breakers 108 may have a circular cross-sectional shape. This is not essential. In other embodiments the flow breakers 108 may have other cross-sectional shapes. For example, the flow breakers 108 may have cross-sections that are elongate, optionally with an axis of elongation that is parallel to an average flow direction at the position of the flow breaker 108. The axis of elongation is the axis along which the cross-section of the flow breaker 108 is the longest. Thus, where the axis of elongation is parallel to the average flow direction at the position of the flow breaker 108, the flow breaker 108 will be elongated along the average flow direction. The flow breakers 108 may have a smooth cross-section (e.g. circular or oval). Alternatively or additionally the flow breakers 108 may have portions that are rough or which have structures such as ridges. The flow breakers 108 may have polygonal cross-sections. Non-limiting examples of cross-sections for flow breakers 108 are illustrated schematically in FIGS. 16-18 (e.g. viewed along an axis of elongation or rotational symmetry of the flow breakers 108). In the examples shown, the flow breakers 108 have rotational symmetry of order 2 but this is not essential. An average direction of flow past the flow breakers 108 is marked by arrows 206. The choice of cross-sectional shape for the flow breakers 108 may depend on ease of manufacturability and/or the resulting drag that the flow breakers 108 apply to the flow. In many situations, therefore, cylindrical or other smooth cross-sections may be favored.

Figure 14:
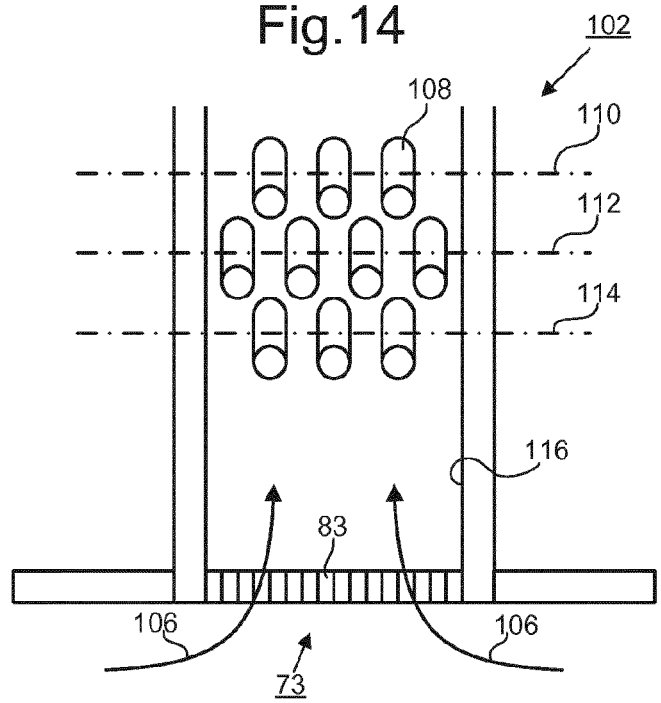
FIG. 14 is a first schematic side sectional view of a fluid extraction conduit of a fluid handling structure according to another embodiment.
Figure 15:
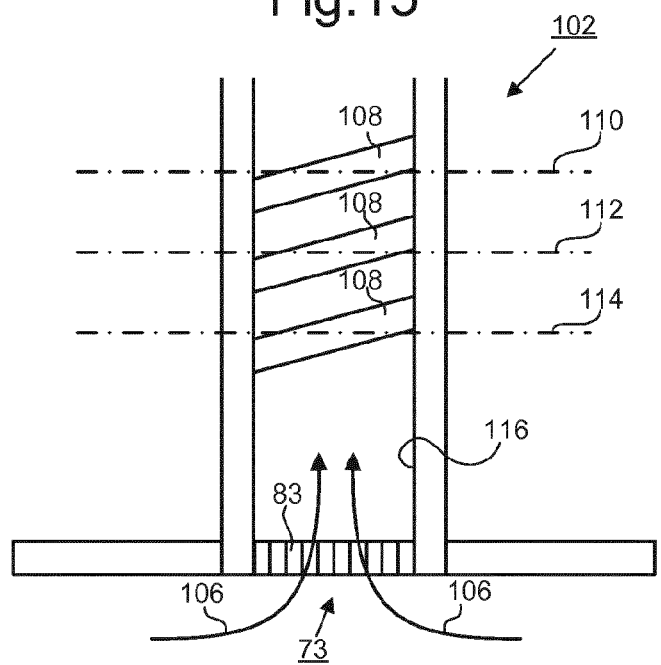
FIG. 15 is a second schematic side sectional view of the fluid extraction conduit of FIG. 14.

In the embodiments of FIGS. 6-13, the flow breakers 108 are all aligned perpendicular to the average direction of flow past the flow breakers 108. This is not essential. In other embodiments the flow breakers 108 may be inclined at an oblique angle relative to the average flow direction past the flow breakers 108. An example of such an embodiment is shown in FIGS. 14 and 15. Here, three sets of flow breakers 108 are provided as in the embodiments of FIGS. 6-13. Each set of flow breakers 108 are cut through by a different common plane 110, 112, 114. In contrast to the embodiments of FIGS. 6-13 the flow breakers 108 do not have axes of elongation or axes of rotational symmetry that lie within the common plane. The axes of elongation and the axes of rotational symmetry are inclined at an oblique angle to the common planes 110, 112, 114.

In an embodiment one or more of the flow breakers 108 may be formed integrally with the peripheral wall 116. In such an embodiment there may be no interface between peripheral wall 116 and the flow breakers 108 that are formed integrally with the peripheral wall 116. In such an embodiment the flow breakers 108 that are formed integrally with the peripheral wall 116 may be formed from the same material as the peripheral wall 116. Examples of flow breakers 108 that are formed integrally with the peripheral wall 116 are shown in FIGS. 9, 11 and 13 for example. Alternatively or additionally, one or more of the flow breakers 108 may be formed non-integrally with the peripheral wall 116. Flow breakers 116 formed non-integrally with the peripheral wall 116 may be adhered to the peripheral wall 116 or mounted to the peripheral wall 116 using other fixing methods. Examples of flow breakers 108 that are formed non-integrally with the peripheral wall 116 are shown in FIGS. 8, 10 and 12.

In an embodiment, at least one of the flow breakers 108 comprises a surface structure configured to inhibit vortex shedding from the flow breaker 108. Vortex shedding occurs where vortices that are created on a downstream side of an object in a flow of fluid periodically detach from the object. Such periodic detachment of vortices from a flow breaker 108 can transmit vibrations to the flow breaker 108. Vibrations transmitted to the flow breaker 108 can be transmitted to other components of the lithographic apparatus and have a negative effect on performance. Providing a surface structure that inhibits vortex shedding can reduce transmission of vibrations and thereby improve performance.

In an embodiment, the at least one flow breaker 108 having the surface structure has an axis of elongation or an axis of rotational symmetry and the surface structure comprises a ridge oriented obliquely relative to the axis of elongation or the axis of rotational symmetry of the surface structure. An example of a flow breaker 108 having such a surface structure is shown in FIG. 19. The axis of elongation is marked 124 and the ridge is marked 120. The oblique angle between the ridge 120 and the axis of elongation 124 is marked 122.

In embodiment the surface structure is a portion of a helix winding around at least a portion of the flow breaker 108. The embodiment of FIG. 19 is an example of this type.

In an embodiment the surface structure comprises an elongate element wound around the flow breaker 108, the elongate element being non-integral or integral with the flow breaker 108. The ridge 120 of FIG. 19 may be formed in this way.

In an embodiment, as depicted in non-limiting examples in FIGS. 20-22, the fluid extraction conduit 102 comprises a first length of conduit 126 downstream from the recovery port 73. The fluid extraction conduit 102 may further comprise a second length of conduit 128 downstream from the first length of conduit 126. The second length of conduit 128 comprises a plurality of flow breakers 108. The plurality of flow breakers 108 may be arranged for example according to any one or more of the embodiments discussed above. The first length of conduit 126 is elongate when viewed in at least one direction perpendicular to the average flow direction. At all positions in the first length of conduit 126 the cross-sectional area of the conduit, perpendicular to the average flow direction, is equal to or greater than the cross-sectional area of the conduit at the upstream end of the first length of conduit 126. Thus, the first length of conduit 126 is entirely free of flow breakers 108, particularly of flow breakers 108 according to any of the embodiments discussed above. For example in an embodiment the first length of conduit 126 does not comprise any flow breakers 108 that protrude inwardly from the peripheral wall 116 or span across the fluid extraction conduit 102 from one region on the peripheral wall 116 to another region on the peripheral wall 116.

Providing the flow breakers 108 in a second length of conduit 128 that is separated from the recovery port 73 at least by a first length of conduit 126 that is free of flow breakers provides an effective balance between efficient suppression of damaging flow instabilities in the fluid extraction conduit 102 and minimizing any negative impact, such as increased flow resistance, caused by the flow breakers 108.

In an embodiment, as shown for example in FIGS. 20 and 21, the first length of conduit 126 is provided immediately downstream of the recovery port 73. In embodiments of this type, at all positions in the first length of conduit 126 the cross-sectional area of the conduit, perpendicular to the average flow direction, is equal to or greater than the cross-sectional area of the conduit immediately downstream from the recovery port 73. In other embodiments, as shown in FIG. 22, the first length of conduit 126 is provided at a position which is not immediately downstream of the recovery port 73. In such embodiments, a further length of conduit 130 may be provided in between the recovery port 73 and the first length of conduit 126. In the embodiment of FIG. 22 the further length of conduit 130 is funnel-shaped with a cross-section that decreases in a downstream direction. The further length of conduit 130 cannot therefore fall within the scope of the first length of conduit 126 because the cross-sectional area of the further length of conduit 130 is not equal to or greater than the cross-sectional area of the further length of conduit 130 at the upstream end of the further length of conduit 130. Alternatively or additionally, lengths of conduit that comprise significant flow breakers 108 will not fall within the scope of the first length of conduit 130 because the flow breakers 108 will have the effect of reducing the cross-sectional area in the conduit.

The above embodiments are particularly effective where the used fluid is a multiphase flow, comprising for example a mixture of gas and liquid. The liquid may be the immersion liquid. Multi-phase flows are particularly prone to flow instabilities that can transmit damaging vibrations to other parts of the lithographic apparatus. Restriction of the space available for such flow instabilities is therefore particularly effective for improving the performance of the lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. A fluid handling structure for use in an immersion lithographic apparatus, wherein the fluid handling structure is configured to provide an immersion fluid to a space between a final element of a projection system and an opposing surface that is moveable relative to the final element of the projection system, the fluid handling structure comprising:
a fluid extraction conduit configured to conduct a used fluid away from the space, wherein the fluid extraction conduit comprises:
a recovery port configured to receive the used fluid into the conduit,
a plurality of flow breakers that each extend across at least a portion of the conduit, and
a peripheral wall configured to contain the fluid peripherally within the conduit;
the flow breakers are positioned downstream of the recovery port;
the flow breakers are arranged so that a common plane cuts through at least a portion of two or more of the flow breakers;

the common plane is aligned so as to be perpendicular to an average direction of flow in the conduit at the position of the common plane when used fluid flows in the conduit; and at least one of the two or more flow breakers having a portion in the common plane is a discrete element with the only connection between the flow breaker and any other of the two or more flow breakers having a portion in the common plane being made via the peripheral wall.

2. The structure according to claim 1, wherein the flow breakers protrude inwardly from the peripheral wall or span across the conduit from one region on the peripheral wall to another region on the peripheral wall.

3. The structure according to claim 1, wherein at least a subset of the plurality of flow breakers are elongate and have associated axes of elongation, or are rotationally symmetric and have associated axes of rotational symmetry, and the axes of elongation or the axes of rotational symmetry lie in the common plane.

4. The structure according to claim 1, wherein at least a subset of the flow breakers are regularly spaced apart from each other.

5. The structure according to claim 1, wherein the fluid extraction conduit comprises a porous member spanning the fluid extraction conduit at a position upstream from the flow breakers.

6. The structure according to claim 1, wherein at least one of the flow breakers comprises a surface structure configured to inhibit vortex shedding from the flow breaker.

7. The structure according to claim 6, wherein the at least one flow breaker having the surface structure has an axis of elongation or an axis of rotational symmetry and the surface structure comprises a ridge oriented obliquely relative to the axis of elongation or the axis of rotational symmetry of the surface structure.

8. The structure according to claim 6, wherein the surface structure is a portion of a helix winding around at least a portion of the flow breaker.

9. The structure according to claim 6, wherein the surface structure comprises an elongate element wound around the flow breaker, the elongate element being non-integral or integral with the flow breaker.

10. The structure according to claim 1, wherein the immersion fluid comprises an immersion liquid and the used fluid comprises a mixture of the immersion liquid and a gas.

11. The structure according to claim 1, wherein the fluid extraction conduit comprises a first length of conduit downstream from the recovery port and a second length of conduit downstream from the first length of conduit; the second length of conduit comprises the plurality of flow breakers;

the first length of conduit is elongate when viewed in at least one direction perpendicular to the average flow direction; and at all positions in the first length of conduit the cross-sectional area of the conduit, perpendicular to the average flow direction, is equal to or greater than the cross-sectional area of the conduit at the upstream end of the first length of conduit.

12. An immersion lithographic apparatus, comprising:
a support configured to support a substrate;
a projection system configured to project a patterned radiation beam onto the substrate; and
the fluid handling structure according to claim 1, wherein the opposing surface is the substrate, the support, or both.

13. A fluid handling structure for use in an immersion lithographic apparatus, wherein the fluid handling structure is configured to provide an immersion fluid to a space between a final element of a projection system and an opposing surface that is moveable relative to the final element of the projection system, the fluid handling structure comprising:

a fluid extraction conduit configured to conduct a used fluid away from the space, wherein the fluid extraction conduit comprises a recovery port configured to receive the fluid into the conduit, a first length of conduit downstream from the recovery port and a second length of conduit downstream from the first length of conduit;

the second length of conduit comprises a flow breaker extending across at least a portion of the conduit;

the first length of conduit is elongate when viewed in at least one direction perpendicular to an average flow direction in the conduit when used fluid flows in the conduit; and at all positions in the first length of conduit the cross-sectional area of the conduit, perpendicular to the average flow direction, is equal to or greater than the cross-sectional area of the conduit at the upstream end of the first length of conduit.

14. The structure according to claim 13, comprising a plurality of flow breakers and wherein:

the fluid extraction conduit comprises a peripheral wall configured to contain the fluid peripherally within the conduit and at least one of the flow breakers protrudes inwardly from the peripheral wall or spans across the conduit from one region on the peripheral wall to another region on the peripheral wall; and the at least one flow breaker is a discrete element with the only connection between the at least one flow breaker and any other of the flow breakers being made via the peripheral wall.

15. The structure according to claim 13, wherein the flow breaker is elongate and has an associated axis of elongation, or is rotationally symmetric and has an associated axis of rotational symmetry, and the axis of elongation or the axis of rotational symmetry lies in a plane aligned perpendicular to the average direction of flow.

16. The structure according to claim 13, comprising a plurality of flow breakers and wherein at least a subset of the flow breakers are regularly spaced apart from each other.

17. The structure according to claim 13, wherein the fluid extraction conduit comprises a porous member spanning the fluid extraction conduit at a position upstream from the flow breaker.

18. The structure according to claim 13, wherein the flow breaker comprises a surface structure configured to inhibit vortex shedding from the flow breaker.

19. A device manufacturing method, comprising:
using a projection system to project a patterned radiation beam onto a substrate through an immersion fluid;
providing the immersion fluid to a space between (i) a final element of the projection system and (ii) the substrate or a support that is supporting the substrate; and
using a fluid extraction conduit to conduct a used fluid away from the space, wherein the fluid extraction conduit comprises a recovery port configured to receive the used fluid into the conduit, a plurality of flow breakers that each extend across at least a portion of the conduit and a peripheral wall configured to contain the fluid peripherally within the conduit;

the flow breakers are positioned downstream of the recovery port;
the flow breakers are arranged so that a common plane cuts through at least a portion of two or more of the flow breakers;
the common plane is aligned so as to be perpendicular to an average direction of flow in the conduit at the position of the common plane; and
at least one of the two or more flow breakers having a portion in the common plane is a discrete element with the only connection between the flow breaker and any other of the two or more flow breakers having a portion in the common plane being made via the peripheral wall.

20. A device manufacturing method, comprising:
using a projection system to project a patterned radiation beam onto a substrate through an immersion fluid;
providing the immersion fluid to a space between (i) a final element of the projection system and (ii) the substrate or a support that is supporting the substrate; and
using a fluid extraction conduit to conduct a used fluid away from the space, wherein the fluid extraction conduit comprises a recovery port configured to receive the fluid into the conduit, a first length of conduit downstream from the recovery port and a second length of conduit downstream from the first length of conduit;
the second length of conduit comprises a flow breaker extending across at least a portion of the conduit;
the first length of conduit is elongate when viewed in at least one direction perpendicular to an average flow direction in the conduit of the used fluid; and
at all positions in the first length of conduit the cross-sectional area of the conduit, perpendicular to the average flow direction, is equal to or greater than the cross-sectional area of the conduit at the upstream end of the first length of conduit.

* * * * *